(12) United States Patent
Chang et al.

(10) Patent No.: US 10,134,701 B2
(45) Date of Patent: Nov. 20, 2018

(54) SOLDER BUMP FOR BALL GRID ARRAY

(71) Applicant: Taiwan Semiconductor Manufacturing Company, Ltd., Hsinchu (TW)

(72) Inventors: Jung-Hua Chang, Hsinchu (TW); Cheng-Lin Huang, Hsinchu (TW); Jing-Cheng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/651,063

(22) Filed: Jul. 17, 2017

(65) Prior Publication Data

US 2017/0317044 A1    Nov. 2, 2017

Related U.S. Application Data

(63) Continuation of application No. 14/451,271, filed on Aug. 4, 2014, now Pat. No. 9,711,472, which is a continuation of application No. 13/572,302, filed on Aug. 10, 2012, now Pat. No. 9,159,687.

(60) Provisional application No. 61/677,891, filed on Jul. 31, 2012.

(51) Int. Cl.
  *H01L 21/44* (2006.01)
  *H01L 23/00* (2006.01)
  *H01L 23/498* (2006.01)

(52) U.S. Cl.
  CPC ........ *H01L 24/13* (2013.01); *H01L 23/49816* (2013.01); *H01L 24/11* (2013.01); *H01L 2224/118* (2013.01); *H01L 2224/13* (2013.01); *H01L 2224/131* (2013.01); *H01L 2224/13016* (2013.01); *H01L 2224/1319* (2013.01); *H01L 2924/014* (2013.01); *H01L 2924/01029* (2013.01); *H01L 2924/06* (2013.01); *H01L 2924/0665* (2013.01); *H01L 2924/15788* (2013.01); *H01L 2924/37001* (2013.01)

(58) Field of Classification Search
  CPC .......... H01L 24/13; H01L 2224/13024; H01L 2225/1058; H01L 24/16; H01L 2224/0401; H01L 2224/97
  USPC .......... 438/612, 613, 614, 622; 257/780.781
  See application file for complete search history.

(56) References Cited

U.S. PATENT DOCUMENTS

| | | | |
|---|---|---|---|
| 5,066,551 A | 11/1991 | Kojima | |
| 5,804,882 A * | 9/1998 | Tsukagoshi | ....... H01L 23/49838 257/690 |
| 6,267,650 B1 | 7/2001 | Hembree | |
| 7,208,842 B2 | 4/2007 | Jeong | |
| 7,312,535 B2 | 12/2007 | Takewaki et al. | |
| 7,387,910 B2 * | 6/2008 | Lee | .......... H01L 24/02 257/738 |

(Continued)

FOREIGN PATENT DOCUMENTS

| | | |
|---|---|---|
| JP | 2006261641 | 9/2006 |
| JP | 2012033692 A | 2/2012 |

(Continued)

*Primary Examiner* — S. V. Clark
(74) *Attorney, Agent, or Firm* — Slater Matsil, LLP

(57) ABSTRACT

A solder bump structure for a ball grid array (BGA) includes at least one under bump metal (UBM) layer and a solder bump formed over the at least one UBM layer. The solder bump has a bump width and a bump height and the ratio of the bump height over the bump width is less than 1.

20 Claims, 4 Drawing Sheets

(56) References Cited

U.S. PATENT DOCUMENTS

| | | | |
|---|---|---|---|
| 7,678,681 B2 * | 3/2010 | Oi | H01L 23/5389 |
| | | | 257/738 |
| 7,755,200 B2 * | 7/2010 | Nguyen | B23K 3/0623 |
| | | | 257/738 |
| 8,035,226 B1 | 10/2011 | Inilcoxen et al. | |
| 2003/0219966 A1 | 11/2003 | Jin et al. | |
| 2006/0027933 A1 | 2/2006 | Chen et al. | |
| 2006/0220244 A1 | 10/2006 | Lu et al. | |
| 2006/0226545 A1 | 10/2006 | Suminoe et al. | |
| 2007/0145551 A1 * | 6/2007 | Yamaji | H01L 21/4853 |
| | | | 257/678 |
| 2009/0047755 A1 * | 2/2009 | Yamaji | H01L 21/4853 |
| | | | 438/121 |
| 2009/0310320 A1 | 12/2009 | Roth et al. | |
| 2011/0233761 A1 | 9/2011 | Hwang et al. | |
| 2012/0086124 A1 | 4/2012 | Yamaguchi | |
| 2012/0126397 A1 | 5/2012 | Chien et al. | |
| 2012/0193783 A1 | 8/2012 | Hong et al. | |
| 2012/0224331 A1 | 9/2012 | Roth et al. | |
| 2013/0043573 A1 | 2/2013 | Williams et al. | |
| 2014/0084491 A1 | 3/2014 | Takahashi et al. | |
| 2014/0124925 A1 | 5/2014 | Sidhu et al. | |
| 2018/0174990 A1 * | 6/2018 | Park | H01L 24/11 |

FOREIGN PATENT DOCUMENTS

| | | |
|---|---|---|
| JP | 2012080043 | 4/2012 |
| KR | 1020050019664 | 3/2005 |

* cited by examiner

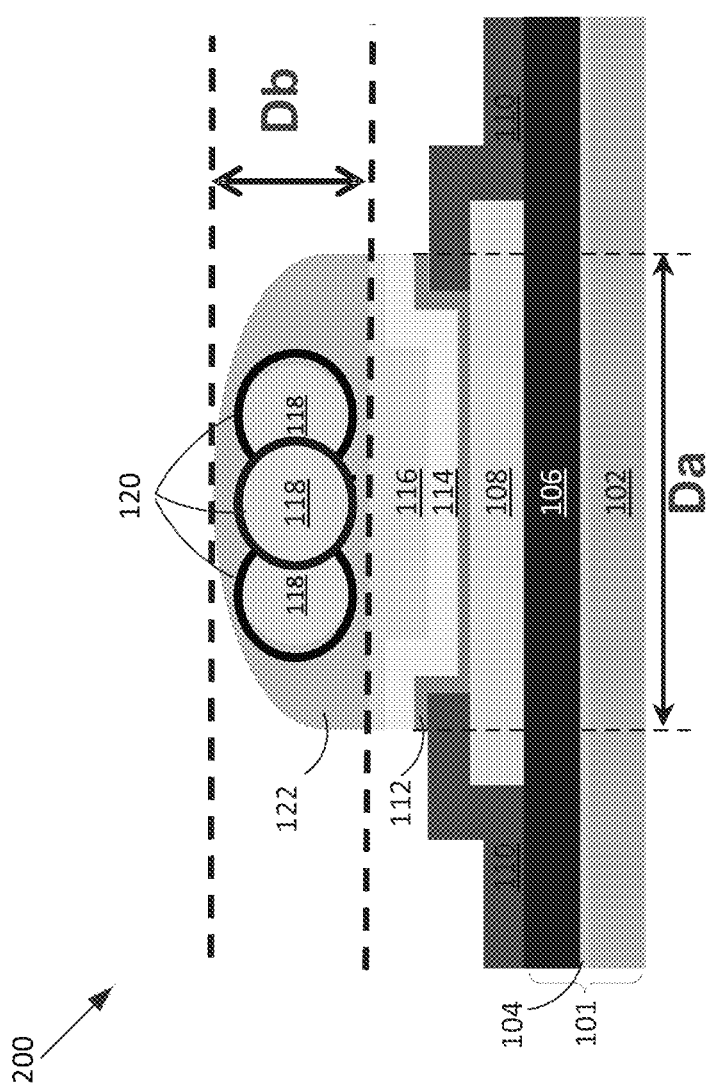

SOLDER BUMP FOR BALL GRID ARRAY

PRIORITY CLAIM AND CROSS-REFERENCE

This application is a continuation of U.S. patent application Ser. No. 14/451,271, filed Aug. 4, 2014 and entitled "Solder Bump for Ball Grid Array," which application is a continuation of U.S. patent application Ser. No. 13/572,302, filed Aug. 10, 2012 and entitled "Solder Bump for Ball Grid Array," now U.S. Pat. No. 9,159,687, issued Oct. 13, 2015, which application claims priority to U.S. Provisional Patent Application No. 61/677,891, filed Jul. 31, 2012, and entitled "Solder Bump for Ball Grid Array," which applications are incorporated herein by reference.

BACKGROUND

Some solder ball structures of a ball grid array (BGA) suffer degradation of electrical connections from solder cracks at connection areas through the solder balls. Further, stand-off height variation among solder balls in an array may degrade electrical connections and reliability.

BRIEF DESCRIPTION OF THE DRAWINGS

Reference is now made to the following descriptions taken in conjunction with the accompanying drawings, in which:

FIG. 2 is a cross-section of another exemplary solder bump structure according to some embodiments.

DETAILED DESCRIPTION

Figure 1:
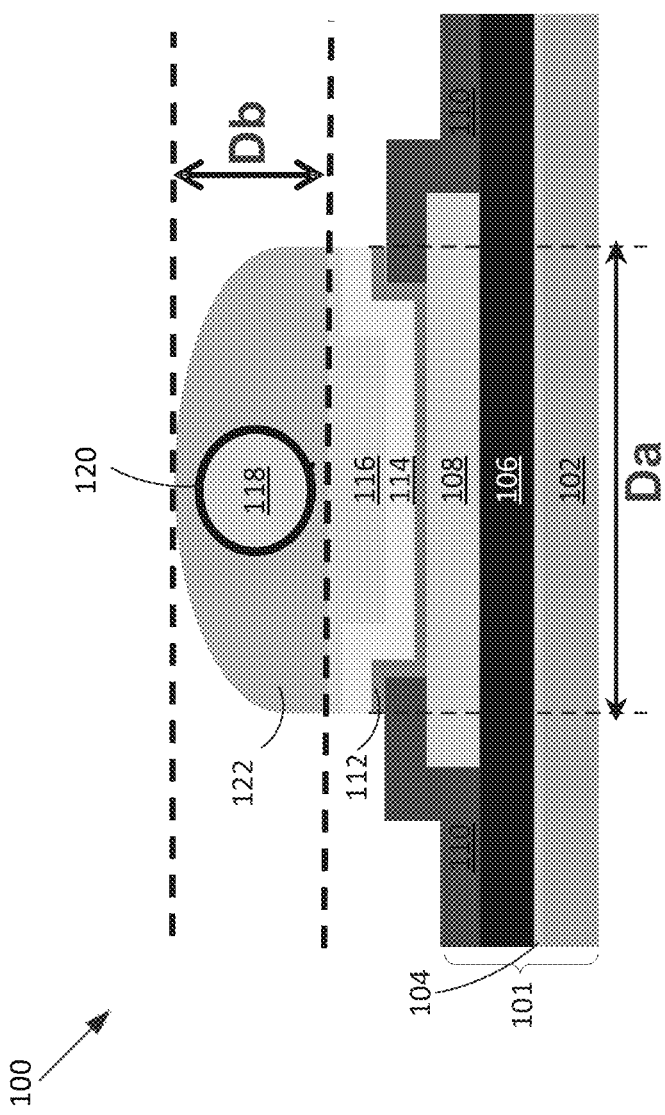
FIG. 1 is a cross-section of an exemplary solder bump structure for a ball grid array (BGA) according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a cross-section of an exemplary solder bump structure 100 for a ball grid array (BGA) according to some embodiments. In the solder bump structure 100, a substrate 101 includes a glass substrate 102 and a silicon substrate 106 bonded together by a glue layer 104. In other embodiments, the substrate 101 can comprise silicon, silicon dioxide, aluminum oxide, sapphire, germanium, gallium arsenide (GaAs), an alloy of silicon and germanium, indium phosphide (InP), or any other suitable material. Also, the substrate 101 can have one substrate layer instead of multiple substrate layers as shown in FIG. 1.

A redistribution layer (RDL) 108 is an electrically conductive layer, used for electrical connections. For example, the redistribution layer 108 connects with input/output (IO) pads in other locations. In some embodiments, the redistribution layer 108 comprises metal such as copper, aluminum, or any other suitable material. A passivation layer 110 comprises oxide or nitride in some embodiments and reduces chemical and/or electrical reactivity of the surface.

The solder bump structure 100 includes under bump metal (UBM) layers 112 and 114. The first layer 112 of the UBM layers comprises Ti, W, Cr, TiW, any combination thereof, or any other suitable material in some embodiments. The second layer 114 comprises Cu, Ni, Ni—V alloy, any combination thereof, or any other suitable material. The diameter of UBM layers 112 and 114 ranges from 20 μm to 600 μm in some embodiments. The UBM layers 112 and 114 can be formed, e.g., by sputtering. Even though two UBM layers 112 and 114 are shown in FIG. 1, different number of layers can be used for UBM.

A copper layer 116 is formed over the second (UBM) layer 114. The copper layer 116 has a thickness (height) that ranges from 5 μm to 20 μm in some embodiments. A solder bump 122 is formed over the copper layer 116 and the second (UBM) layer 114. The solder bump 122 has a bump width Da and a bump height Db. The ratio $\alpha=Db/Da$ is in the range $0.05 \leq \alpha < 1$ in some embodiments, thus the shape of the solder bump 122 is relatively flat compared to a spherical solder ball shape. This provides a greater contact area for the solder bump 122, which reduces defective electrical connection of the solder bump 122 and improves reliability.

The bump height Db can be determined from the diameter of the UMB layers 112 and 114 and the desired ratio α depending on applications. The solder bump 122 can comprise any suitable material, and lead-free material is used for the solder bump 122 in some embodiments.

There is one non-metallic core 118 inside the solder bump 122 in FIG. 1 and there can be more than one non-metallic core 118 or no core in other embodiments. The non-metallic core 118 comprises epoxy, polymer, or any other suitable material, and will alternately be referred to herein as a plastic core. In one example, a divinyl benzene cross-linked polymer is used for the plastic core 118. The diameter of the plastic core 118 ranges from 10 μm to 700 μm in some embodiments. A conductive layer 120 surrounds the plastic core 118 in some embodiments. The conductive layer 120 can comprise copper or any other suitable material. The thickness of the conductive layer 120 ranges from 3 μm to 20 μm in some embodiments.

The plastic core 118 provides a stable standoff height for assembly, which helps to avoid the problem of solder bridging. Also, the plastic core 118 could help to disperse stress in the solder bump structure 100 and to avoid or reduce solder cracking. This improves reliability.

FIG. 2 is a cross-section of another exemplary solder bump structure 200 according to some embodiments. The solder bump structure 200 is similar to the solder bump structure 100 in FIG. 1 except that there are three plastic cores 118. There can be any other number of plastic cores 118 or no plastic core in other embodiments.

Figure 3A:
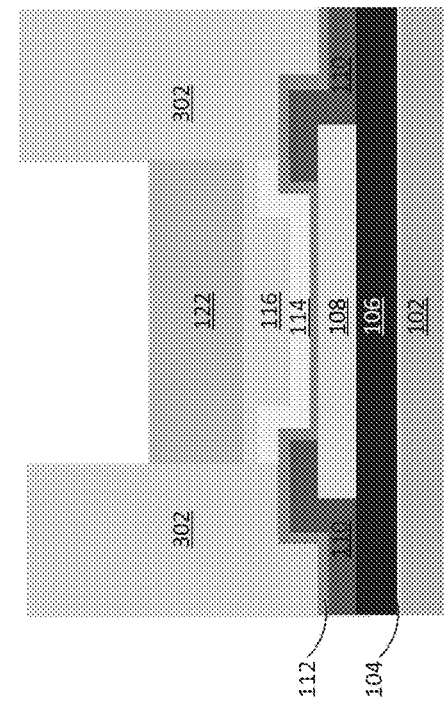
FIGS. 3A-3G are intermediate steps of an exemplary fabrication process of the solder bump structure in FIG. 1 according to some embodiments.

FIGS. 3A-3G are intermediate steps of an exemplary fabrication process of the solder bump structure in FIG. 1 according to some embodiments. In FIG. 3A, a photoresist layer 302, e.g., a dry film resist (DFR), is deposited over the UBM layers 112 and 114, and partially removed by photolithography to expose the second UBM layer 114. The first (UBM) layer 112 comprises Ti, W, Cr, TiW, any combination thereof, or any other suitable material in some embodiments. The second (UBM) layer 114 comprises Cu, Ni, Ni—V alloy, any combination thereof, or any other suitable material.

Figure 3B:
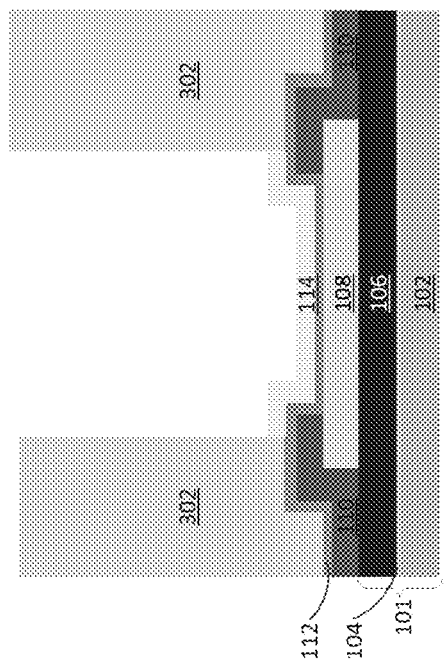

In FIG. 3B, bump plating is performed to deposit the copper layer 116 and the solder bump 122. The copper layer 116 has a thickness (height) that ranges from 5 µm to 20 µm in some embodiments. The solder bump 122 has a bump width Da and a bump height Db as shown in FIG. 1. The ratio $\alpha=Db/Da$ is in the range $0.05 \leq \alpha < 1$ in some embodiments, thus the shape of the solder bump 122 is relatively flat compared to a spherical solder ball shape. This provides a greater contact area for the solder bump 122, which reduces defective electrical connection of the solder bump 122 and improves reliability.

The bump height Db can be determined from the diameter of the second (UMB) layer 114 and the ratio $\alpha$ in some embodiments. The solder bump 122 can comprise any suitable material, and lead-free material is used for the solder bump 122 in some embodiments. The solder bump 122 can be formed, e.g., by electroplating over the copper layer 116. The solder bump 122 comprises tin as a principal element in some embodiments.

Figure 3C:
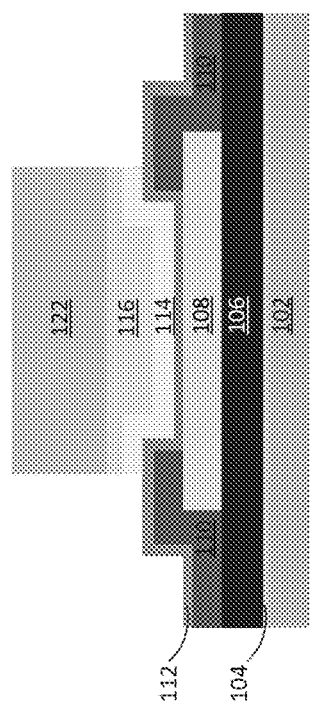

In FIG. 3C, the photoresist layer 302 is stripped (removed) after the bump plating described above.

Figure 3D:
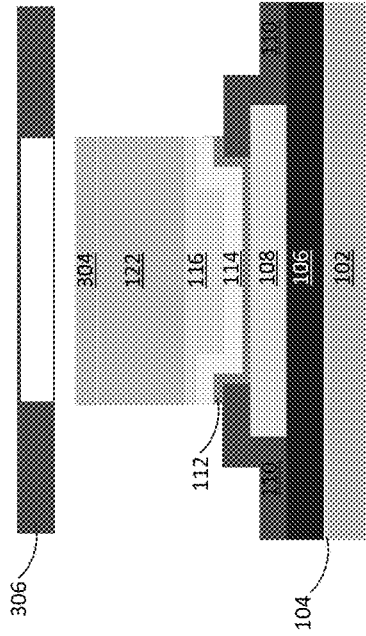

In FIG. 3D, the (first) UBM layer 112 is etched using the solder bump 122 as a mask.

Figure 3E:
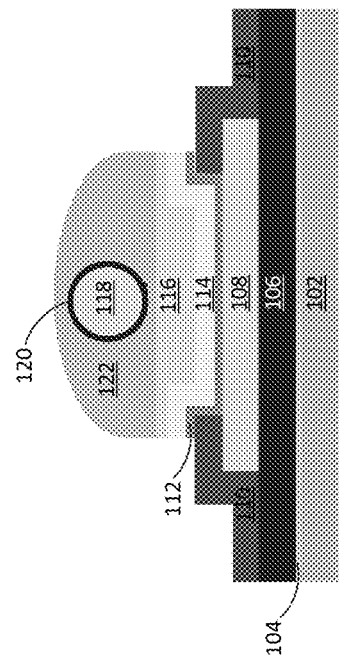

In FIG. 3E, flux material 304 is printed over the solder bump 122 using a stencil 306. The opening size of the stencil 306 is about 90% of the diameter of UBM layers 112 and 114 in some embodiments.

Figure 3F:
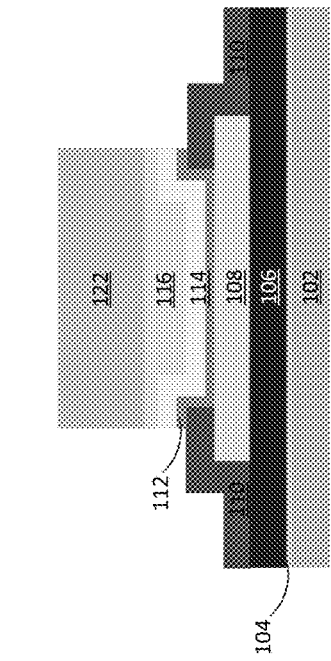

In FIG. 3F, the plastic core 118 having the surrounding conductive layer 120 is mounted (i.e., ball mounting) using a stencil 308. The plastic core 118 can comprise epoxy, polymer, or any other suitable material. In one example, divinyl benzene cross-linked polymer is used for the plastic core 118. The conductive layer 120 comprises copper or any other suitable material in some embodiments. The plastic core 118 provides stable standoff height for assembly, which helps to avoid solder bridging. Also, the plastic core 118 could help stress dispersion in the solder bump structure 100 and avoid solder cracking, which improves reliability. The opening size of the stencil 308 is about 120% of the total diameter of the plastic core 118 with the conductive layer 120 in some embodiments.

Figure 3G:
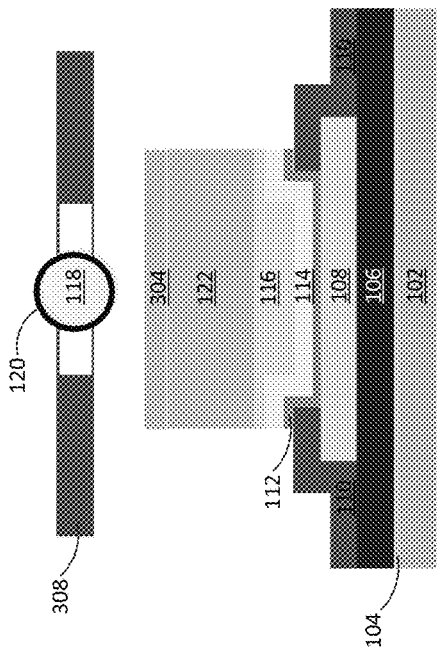

In FIG. 3G, the solder bump 122 is reflowed and the plastic core 118 is positioned inside the solder bump 122. In some embodiments, the reflow is performed at peak temperature ranging from 230° C. to 270° C., depending on the solder bump 122 material. Afterwards, the flux material 304 is cleaned, e.g., using water.

According to some embodiments, a solder bump structure for ball grid array (BGA) includes at least one under bump metal (UBM) layer and a solder bump formed over the at least one UBM layer. The solder bump has a bump width and a bump height and the ratio of the bump height over the bump width is less than 1.

According to some embodiments, a method of forming a solder bump structure for a ball grid array (BGA) includes forming at least one under bump metal (UBM) layer over a substrate. A solder bump is formed over the at least one UBM layer. The solder bump has a bump width and a bump height. The ratio of the bump height over the bump width is less than 1.

According to some embodiments, an integrated circuit includes a substrate, at least one under bump metal (UBM) layer formed over the substrate, and a lead-free solder bump formed over the at least one UBM layer. The solder bump has at least one plastic core inside. The solder bump has a bump width and a bump height, and a ratio of the bump height over the bump width is less than 1.

According to some embodiments, a method includes: forming a redistribution layer over a substrate; forming a passivation layer over the redistribution layer and the substrate; forming an under bump metal (UBM) layer over the redistribution layer and the passivation layer; depositing a mask layer over the UBM layer; patterning the mask layer with an opening over the redistribution layer to form a patterned layer, the opening exposing the UBM layer; plating portions of the UBM layer exposed by the patterned layer to form a first conductive layer over the UBM layer in the opening; depositing a solder material in the opening over the first conductive layer; placing one or more insulating cores over the solder material; and reflowing the solder material to form a conductive bump having the insulating cores therein, the conductive bump having a width and a height, the ratio of the height to the width being between 0.05 and 1.

According to some embodiments, a method includes: forming a redistribution layer over a substrate; forming a plurality of under bump metal (UBM) layers over the redistribution layer; depositing a solder material over the UBM layers, the solder material and the UBM layers having a same first width; placing an insulating core on the solder material; and reflowing the solder material to form a conductive bump having the insulating core therein, the conductive bump having the first width and a first height, the ratio of the first height to the first width being between 0.05 and 1.

According to some embodiments, a device includes: a redistribution layer over a substrate; a passivation layer over the redistribution layer and the substrate; a plurality of under bump metal (UBM) layers over the redistribution layer and the passivation layer; a first conductive layer over the UBM layers; a conductive bump over the first conductive layer, where the conductive bump, the first conductive layer, and the UBM layers each have a same first width, where the conductive bump has a first height, the ratio of the first height to the first width being between 0.05 and 1; one or more insulating cores in the conductive bump; and one or more second conductive layers, each of the second conductive layers surrounding a respective one of the insulating cores.

A skilled person in the art will appreciate that there can be many embodiment variations of this disclosure. Although the embodiments and their features have been described in detail, it should be understood that various changes, substitutions, and alterations can be made herein without departing from the spirit and scope of the embodiments. Moreover, the scope of the present application is not intended to be limited to the particular embodiments of the process, machine, manufacture, and composition of matter, means, methods, and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method comprising:
    forming a redistribution layer over a substrate;
    forming a passivation layer over the redistribution layer and the substrate;
    forming an under bump metal (UBM) layer over the redistribution layer and the passivation layer;
    depositing a mask layer over the UBM layer;
    patterning the mask layer with an opening over the redistribution layer to form a patterned layer, the opening exposing the UBM layer;
    plating portions of the UBM layer exposed by the patterned layer to form a first conductive layer over the UBM layer in the opening;
    depositing a solder material in the opening over the first conductive layer;
    placing one or more insulating cores over the solder material; and
    reflowing the solder material to form a conductive bump having the insulating cores therein, the conductive bump having a width and a height, the ratio of the height to the width being between 0.05 and 1.

2. The method of claim 1, further comprising:
    removing the patterned layer; and
    after the removing the patterned layer, forming a flux material over the solder material, wherein the placing the insulating cores over the solder material comprises placing the insulating cores on the flux material.

3. The method of claim 2, further comprising:
    after the reflowing the solder material, removing the flux material.

4. The method of claim 2, further comprising:
    after the removing the patterned layer, etching the UBM layer using the solder material as an etch mask to remove portions of the UBM layer exposed by the etch mask.

5. The method of claim 1, wherein the UBM layer comprises multiple layers, and wherein forming the UBM layer comprises:
    forming a bottommost UBM layer on the redistribution layer; and
    forming a topmost UBM layer on the bottommost UBM layer, the bottommost UBM layer and the topmost UBM layer comprising different conductive materials.

6. The method of claim 5, wherein:
    the bottommost UBM layer comprises Ti, W, Cr, or TiW; and
    the topmost UBM layer comprises Cu, Ni, or Ni—V alloys.

7. The method of claim 1, wherein the placing the one or more insulating cores over the solder material comprises placing a single insulating core over the solder material.

8. The method of claim 1, wherein the placing the one or more insulating cores over the solder material comprises placing a plurality of insulating cores over the solder material.

9. The method of claim 1, wherein the insulating cores comprise an epoxy, a polymer, or a divinyl benzene crosslined polymer, and wherein the method further comprises:
    forming a second conductive layer surrounding the insulating cores.

10. A method comprising:
    forming a redistribution layer over a substrate;
    forming a plurality of under bump metal (UBM) layers over the redistribution layer;
    depositing a solder material over the UBM layers, the solder material and the UBM layers having a same first width;
    placing an insulating core on the solder material; and
    reflowing the solder material to form a conductive bump having the insulating core therein, the conductive bump having the first width and a first height, the ratio of the first height to the first width being between 0.05 and 1.

11. The method of claim 10, wherein the plurality of UBM layers each comprise different conductive materials.

12. The method of claim 10, further comprising:
    forming a conductive layer surrounding the insulating core.

13. The method of claim 10, wherein the reflowing the solder material is performed at a temperature of from about 230° C. to about 270° C.

14. A device comprising:
    a redistribution layer over a substrate;
    a passivation layer over the redistribution layer and the substrate;
    a plurality of under bump metal (UBM) layers over the redistribution layer and the passivation layer;
    a first conductive layer over the UBM layers;
    a conductive bump over the first conductive layer, wherein the conductive bump, the first conductive layer, and the UBM layers each have a same first width, wherein the conductive bump has a first height, the ratio of the first height to the first width being between 0.05 and 1;
    one or more insulating cores in the conductive bump; and
    one or more second conductive layers, each of the second conductive layers surrounding a respective one of the insulating cores.

15. The device of claim 14, wherein the plurality of under bump metal (UBM) layers comprises:
    a bottommost UBM layer on the redistribution layer, the bottommost UBM layer comprising Ti, W, Cr, or TiW; and
    a topmost UBM layer on the bottommost UBM layer, the topmost UBM layer comprising Cu, Ni, or Ni—V alloys.

16. The device of claim 14, wherein the insulating cores comprise an epoxy, a polymer, or a divinyl benzene crosslined polymer.

17. The device of claim 14, wherein the first conductive layer and the second conductive layers comprise copper.

18. The device of claim 14, wherein the first width is from 20 µm to 600 µm.

19. The device of claim 14, wherein the one or more insulating cores are a single insulating core.

20. The device of claim 14, wherein the one or more insulating cores are a plurality of insulating cores.

* * * * *